(12) United States Patent
Lin

(10) Patent No.: US 8,250,429 B2
(45) Date of Patent: Aug. 21, 2012

(54) TURBO ENCODER AND HARQ PROCESSING METHOD APPLIED FOR THE TURBO ENCODER

(75) Inventor: Hua Lin, Tokyo (JP)

(73) Assignee: NEC Corporation, Tokyo (JP)

( * ) Notice: Subject to any disclaimer, the term of this patent is extended or adjusted under 35 U.S.C. 154(b) by 934 days.

(21) Appl. No.: 12/301,119

(22) PCT Filed: May 17, 2007

(86) PCT No.: PCT/JP2007/060097
§ 371 (c)(1),
(2), (4) Date: Nov. 17, 2008

(87) PCT Pub. No.: WO2007/132912
PCT Pub. Date: Nov. 22, 2007

(65) Prior Publication Data
US 2009/0106618 A1    Apr. 23, 2009

(30) Foreign Application Priority Data
May 17, 2006    (JP) .................................. 2006-137145

(51) Int. Cl.
*G06F 11/00* (2006.01)
(52) U.S. Cl. ........................................ 714/755
(58) Field of Classification Search .................... 714/755
See application file for complete search history.

(56) References Cited

U.S. PATENT DOCUMENTS

| | | | | |
|---|---|---|---|---|
| 7,827,465 B2 * | 11/2010 | Eroz et al. | ...................... | 714/755 |
| 7,873,893 B2 * | 1/2011 | Nimbalker et al. | ........... | 714/755 |
| RE42,675 E * | 9/2011 | You et al. | ...................... | 370/209 |
| 2002/0004924 A1 * | 1/2002 | Kim et al. | ...................... | 714/752 |
| 2002/0163880 A1 * | 11/2002 | Matsumoto | .................... | 370/208 |
| 2003/0028838 A1 * | 2/2003 | Chang et al. | .................... | 714/755 |
| 2004/0025103 A1 * | 2/2004 | Obuchii et al. | ............... | 714/755 |
| 2005/0110286 A1 * | 5/2005 | Zhang | ............................ | 293/154 |
| 2006/0069978 A1 * | 3/2006 | Soogoori | ...................... | 714/755 |
| 2007/0082696 A1 * | 4/2007 | Wang | .......................... | 455/550.1 |
| 2008/0016425 A1 * | 1/2008 | Khan et al. | .................... | 714/755 |
| 2008/0065954 A1 * | 3/2008 | Eroz et al. | ...................... | 714/757 |
| 2008/0098273 A1 * | 4/2008 | Blankenship et al. | ........ | 714/746 |

(Continued)

FOREIGN PATENT DOCUMENTS
JP    2004096769 A    3/2004
(Continued)

OTHER PUBLICATIONS

International Search Report for PCT/JP2007/060097 mailed Jul. 17, 2007.

(Continued)

*Primary Examiner* — Bryce Bonzo
(74) *Attorney, Agent, or Firm* — Michael Dryja

(57) ABSTRACT

A turbo encoder is provided to be capable of improving its performance in the case that the redundancy is low. A first constituent encoder (1) of an output device of the turbo encoder inputs a data coding sequence (Xk) directly and outputs a redundant data sequence (Zk). A second constituent encoder (2) inputs data coding information (X'k) mixed with the data coding sequence by an interleaver (3), and outputs a redundant data sequence (Z'k). A buffer (4) holds the data coding information (X'k) mixed with the data coding sequence by the interleaver (3). Thus, the data coding sequence (Xk), the redundant data sequences (Zk), (Z'k) and the data coding information (X'k) held by the buffer (4) are output in this order.

12 Claims, 7 Drawing Sheets

U.S. PATENT DOCUMENTS

| | | | |
|---|---|---|---|
| 2010/0031125 A1* | 2/2010 | Shen et al. | 714/781 |
| 2011/0038438 A1* | 2/2011 | Kim et al. | 375/298 |
| 2011/0197104 A1* | 8/2011 | Nimbalker et al. | 714/752 |

FOREIGN PATENT DOCUMENTS

| | | |
|---|---|---|
| JP | 2004-007028 A | 8/2004 |
| JP | 2005073266 A | 3/2005 |

OTHER PUBLICATIONS

"3rd Generation Partnership Project; Technical Specification Group Radio Access Network; Multiplexing and Channel coding (FDD), (Release 7)", TS25.212, V7.0.0, Mar. 2006, pp. 16-21.

Office action issued in counterpart Japanese patent application, dated Apr. 25, 2012.

* cited by examiner

TURBO ENCODER AND HARQ PROCESSING METHOD APPLIED FOR THE TURBO ENCODER

APPLICABLE FIELD IN THE INDUSTRY

The present invention relates to a turbo encoder and an HARQ (Hybrid Automatic Repeat reQuest) processing method applied therefor, and more particularly to an HARQ processing method in the turbo encoder.

BACKGROUND ART

At present, in 3GPP (3rd Generation Partnership Project), standardization is in progress with respect to a W-CDMA (Wideband-Code Division Multiple Access) technique that is one of third-generation mobile communication systems. Moreover, as one theme for the standardization, there is specified an HSDPA (High Speed Downlink Packet Access) system that provides a high-speed packet transfer of maximum approx. 14 Mbps in a downlink.

The HSDPA employs an adaptive coding modulation technique, and, for example, is characterized in that switching between a QPSK (Quadrature Phase Shift Keying) modulation technique and a 16 QAM (16 Quardrature Amplitude Modulation) technique is made in accordance with radio environments between a base station and a mobile station. Moreover, the HSDPA employs an HARQ (Hybrid Automatic Repeat reQuest) technique.

The HSDPA is characterized in that, when a mobile station has detected an error with respect to reception data from a base station, the data is retransmitted from the base station in response to a request from the mobile station and the mobile station carries out error correction decoding by employing both the already received data and the retransmitted reception data. Thus, the HARQ effectively utilizes the already received data even if an error exists, thereby enhancing a gain of the error correction decoding and suppressing an increase in the number of times of retransmission.

As a principal transport channel for use in the HSDPA, there exists HS-DSCH (High Speed-Downlink Shared Channel). In the HS-DSCH, a data arrives at a coding unit as at most one transport block TTI (Transmission Time Interval) by TTI. As a process of coding the HS-DSCH, there exist CRC (Cyclic Redundancy Check) addition, turbo coding, HARQ, modulation (16 QAM/QPSK), etc (for example, see Non-patent document 1).

The conventional (3GPP-Standard) output device of the turbo encoder as mentioned above includes two constituent encoders (1st constituent encoder 100 and 2nd constituent encoder 200) as shown in FIG. 4. Herein, the 1st constituent encoder 100 is configured of a switch 101, operators (adders) 102 to 105, and delay circuits (D) 106 to 108, and 2nd constituent encoder 200 is configured of a switch 201, operators (adders) 202 to 205, and delay circuits (D) 206 to 208.

One constituent encoder (the 1st constituent encoder 100) directly inputs a data coding sequence Xk, whereas the other constituent encoder (the 2nd constituent encoder 200) inputs a sequence (a data coding sequence X'k) mixed with the data coding sequence by an interleaver (Turbo Code internal interleaver) 300.

Specifically, the data coding sequence (Systematic Bits) Xk is redundant data sequences Zk and Z'k that are output by two constituent encoders (the 1st constituent encoder 100 and the 2nd constituent encoder 200), respectively. Information X'k obtained by performing an interleaving process for the data coding sequence Xk is not outputted. The reason is that if a decoding side can decode the data coding sequence Xk, performing the interleaving process therefor makes it possible to obtain the information X'k for which the interleaving process has been performed.

A tail bit is an end bit for setting the bit held by each constituent encoder (the 1st constituent encoder 100 and the 2nd constituent encoder 200) back to zero after finishing the coding of the data sequence. A rate of the turbo Code is ⅓, and the output order is an order of X1, Z1, Z'1, X2, Z2, Z'2, ..., Xn, Zn, and Z'n [where n=a code block size of the turbo coding]. However, with normal coding of the data sequence, three kinds of codes are outputted, whereas, with coding of the tail bit, four kinds of codes are outputted. That is, according to a route of a signal line shown by dotted lines of FIG. 4, Xn+1, Zn+1, Xn+2, Zn+2, Xn+3, Zn+3, X'n+1, Z'n+1, X'n+2, Z'n+2, X'n+3, and Z'n+3 are outputted in this order.

In bit separation of the HRAQ, the turbo-coded data sequence, as shown in FIG. 5, lines up in an order of a 1st data coding bit (1st Systematic bit), a 1st Parity 1 bit, a 1st Parity 2 bit, a 2nd Parity 1 bit, a 2nd Parity 2 bit, a 3rd data coding sequence (3rd Systematic bit), ..., a tail bit, so a bit separation unit 400 sequentially separates them into three sequences of a 1st sequence 401: (all Systematic bits)+(some tail bits of Systematic & Parity 1 & Parity 2), a 2nd sequence 402: (all Parity 1 bits)+(some tail bits of Systematic & Parity 1 & Parity 2), and a 3rd sequence 403: (all Parity 2 bits)+(some tail bits of Systematic & Parity 1 & Parity 2).

The HARQ process is for causing the output bit number of the turbo code to match with a total bit number of a physical channel that is mapped to the HS-DSCH.

A Hybrid ARQ functionality, as shown in FIG. 6, is configured of two rate-matching stages (a 1st rate matching 620 and a 2nd rate matching 640) and one virtual buffer (virtual IR buffer 630).

Further, the 1st rate matching 620 includes a rate matching (RM_P1_1) 621 and a rate matching (RM_P2_1) 622, and the 2nd rate matching 640 includes a rate matching (RM_S) 641 and a rate matching (RM_P1_2) 642, and a rate matching (RM_P2_2) 643.

The 1st rate matching 620 (1st rate matching stage) causes the input bit number to match with the number of the bits (which are given by a higher layer) of the virtual IR buffer 630. However, when the input bit number does not exceed a capacity (bit number) of the virtual IR buffer 630, no process is performed for the data even though this 1st rate matching 620 is transparent hereto.

The 2nd rate matching 640 (2nd rate matching stage) causes the number of the bits subsequent to the process of the 1st rate matching 620 to match with a physical channel bit number at its TTI.

The 1st rate matching 620 of the HARQ, when the input bit number exceeds a capacity (bit number) of the virtual IR buffer 630, removes bits that are located at an appropriate position in sequences of the Parity 1 (2nd Sequence) and the Parity 2 (3rd Sequence). The removal position is decided with computation using a rate matching parameter. The data coding sequence (1st Sequence), which is not punctured, is directly inputted into the virtual IR buffer 630. The so-called puncturing process is a process of extracting the bit from the bit sequence at a constant period.

Next, how to calculate the 1st rate matching parameter in accordance with the conventional method will be explained.

(1) When $N_{IR} < N^{TTI}$, the number of bits that should be punctured $$\Delta N_{il}^{TTI} = N_{IR} - N^{TTI}$$ [Numerical equation 1]

is computed. Where, $N^{TTI}$ is a total number of the bits that are inputted from the turbo encoder.

(2) Set a=2 when b=2;
a=1 when b=3
In a case of puncturing the Parity 1 bit, it follows that b=2.
In a case of puncturing the Parity 2 bit, it follows that b=3.
(3) Set $$\Delta N_i = \begin{cases} \lfloor \Delta N_{il}^{TTI}/2 \rfloor, b=2 \\ \lceil \Delta N_{il}^{TTI}/2 \rceil, b=3 \end{cases} \quad \text{[Numerical equation 2]}$$

where,

A function $\lceil y \rceil$: an integral value is obtained, that is,
$y \leq \lceil y \rceil < y+1$ A function $\lfloor y \rfloor$: an integral value is obtained, that is,
$y-1 < \lfloor y \rfloor \leq y$     [Numerical equation 3]

(4) Computation of the rate matching parameter $K_i = N^{TTI}/3$ $e_{ini} = K_i$ $e_{plus} = \alpha \times K_i$ $e_{minus} = \alpha \times |\Delta N_i|$ One example of the 1st rate matching process of the HARQ that is performed for the output of the turbo encoder shown in FIG. 4 is shown in FIG. 7. In this example, the process of the 1st rate matching of the HARQ process at the time that the bit number $N^{TTI}$ subsequent to the channel coding is 1500 and the number $N_{IR}$ of the bits allocated to the virtual IR buffer 630 is 1200 is exemplified.

In HARQ bit separation, the turbo-coded data is separated into three sequences of a data coding sequence (Systematic), a Parity 1 sequence (1st parity), and a Parity 2 sequence (2nd parity). Each of the data coding sequence, the Parity 1 sequence, and the Parity 2 sequence is configured of 496-bit code information and 4-bit tail bit information. The 4-bit tail bit information of each sequence has one part of the data coding sequence and each tail bit of the Parity 1 sequence and the Parity 2 sequence mixed.

Next, in the HARQ 1st rate matching, the rate matching with the capacity $N_{IR}=1500$ of the virtual IR buffer 630 is carried out (it is only the parity bit that is punctured).

Upon computing the 1st rate matching parameter in accordance with the conventional, $\Delta N_{il}^{TTI} = 1200 - 1500 = -300$     [Numerical equation 4]

$K_i = 1500/3 = 500$

The rate matching parameter of the Parity 1 is as follows.

$e_{ini} = 500$ $e_{plus} = 2 \times 500 = 1000$ $e_{minus} = 2 \times |\Delta N_i| = 2 \times 150 = 300$ And, the rate matching parameter of the Parity 2 is as follows.

$e_{ini} = 500$ $e_{plus} = 500$ $e_{minus} = |\Delta N_i| = 150$

Non-patent document: "Multiple and channel coding 4.2.3.2 Turbo coding" [3GPP TS 25.212 V7.0.0 (2006-03) p. 16-21]

DISCLOSURE OF THE INVENTION

Problems to be Solved by the Invention

The conventional HARQ processing method described above causes a problem that the tail bits of the data coding sequence partially exist in the sequence of the Parity 1 and the Parity 2, whereby the above tail bit could be removed, depending upon a rate matching parameter, when the 1st rate matching process is performed.

In the conventional method, trellis termination of the decoding becomes impossible at the time of turbo decoding due to loss of the tail bit of this data coding sequence, and resultantly a decoding performance declines. In particular, when a code redundancy is low (when a large number of the parity bits are punctured), a decline in the performance becomes conspicuous. This demands a configuration such that tail bits of all data coding sequences of the turbo encoder are prevented from being punctured when the bit separation and the 1st rate matching of the HARQ are carried out.

Thereupon, an object of the present invention is to provide a turbo encoder that is capable of releasing the above-mentioned points at issue and improving a performance of an encoder when a redundancy is low, and an HARQ processing method applied therefor.

Means for Solving the Problem

The turbo encoder in accordance with the present invention, which is a turbo encoder for, as a coding output of a data sequence, sequentially outputting a data coding sequence obtained by coding the data sequence, a 1st redundant data sequence, which is outputted from a 1st constituent encoder, with the data coding sequence assumed to be an input, and a 2nd redundant data sequence, which is outputted from a 2nd constituent encoder, with the sequence obtained by interleaving the data coding sequence assumed to be an input, includes a holding means for holding the sequence obtained by interleaving the data coding sequence, and adds a tail bit, being an end bit for setting the bits held by the 1st constituent encoder and the 2nd constituent encoder back to zero in the interleaved sequence held by the holding means, to an end of the coding output.

The HARQ processing method in accordance with the present invention is an HARQ (Hybrid Automatic Repeat reQuest) processing method that is employed for a turbo encoder for, as a coding output of a data sequence, sequentially outputting a data coding sequence obtained by coding the data sequence, a 1st redundant data sequence, which is outputted from a 1st constituent encoder, with the data coding sequence assumed to be an input, and a 2nd redundant data sequence, which is outputted from a 2nd constituent encoder, with the sequence obtained by interleaving the data coding sequence assumed to be an input, wherein a tail bit, being an end bit for setting the bits held by the 1st constituent encoder and the 2nd constituent encoder back to zero in the sequence obtained by interleaving the data coding sequence, is added to an end of the coding output.

That is, the turbo encoder of the present invention is characterized in improving a performance of the turbo code by improving the 1st rate matching processing method at the time of carrying out the process of outputting the tail bit that is added to an end of the data coding sequence (Systematic sequence), and the HARQ (Hybrid Automatic Repeat reQuest).

Namely, in an output device of the turbo encoder of the present invention, the 1st constituent encoder directly inputs a data coding sequence Xk and outputs a redundant data sequence Zk, the 2nd constituent encoder inputs a data coding information X'k mixed with the data coding sequence by the interleaver, and outputs a redundant data sequence Z'k, and a buffer holds the data coding information X'k mixed with the data coding sequence by the interleaver. Thus, the data coding sequence Xk, the redundant data sequences Zk and Z'k, and the data coding information X'k held by the buffer 4 are outputted in this order from the above-mentioned output device.

In the turbo encoder of the present invention, the order in which the tail bit of not-interleaved data coding sequence, the tail bit of the Parity 1 and the tail bit of the Parity 2 are output is identical to the normal order of the coding output, and the tail bit of the interleaved data coding sequence is outputted lastly. In this case, the tail bit of the interleaved data coding sequence is stored in the buffer, and is added to an end of the coding output.

Further, the turbo encoder of the present invention, in the bit separation that is a process subsequent to the turbo coding, adds the tail bits of all data coding sequences to the data coding sequence, adds the tail bits of all Parity 1 to the Parity 1 sequence, and adds the tail bits of all Parity 2 to the Parity 2 sequence.

In addition hereto, the turbo encoder of the present invention computes the rate matching parameter when carrying out the 1st rate matching of the HARQ.

In addition hereto, the turbo encoder of the present invention decides the position in which the parity bit is removed according to the method of computing the above-mentioned rate matching parameter when carrying out the 1st rate matching of the HARQ.

In the turbo encoder of the present invention, this prevents the tail bit of the data coding sequence from being punctured when the 1st rate matching of the HARQ is carried out, thereby enabling a performance of the encoder to be improved in particular when the redundancy is low (when a large number of the parity bits are punctured).

Further, in the turbo encoder of the present invention, the above-mentioned process can be realized by adding a simplified circuit, which enables an improvement in the performance of the encoder to be easily realized. Such a decoding process is demanded in particular when a turbo encoding/decoding device has been installed into an appliance such as a portable telephone that is strictly requested to have an error correcting ability.

An Advantageous Effect of the Invention

In the present invention, an effect that assuming the above-mentioned configuration and operation enables a performance of the encoder to be improved when the redundancy is low (when a large number of the parity bits are punctured).

DESCRIPTION OF NUMERALS

| | |
|---|---|
| 1 | 1st constituent encoder |
| 2 | 2nd constituent encoder |
| 3 | interleaver |
| 4 | buffer |
| 5 | bit separation unit |
| 6 | 1st rate matching unit |
| 11 and 21 | switches |
| 12 to 15 and 22 to 25 | operators |
| 16 to 18 and 26 to 28 | delay circuits |
| 51 | 1st sequence |
| 52 | 2nd sequence |
| 53 | 3rd sequence |

BEST MODE FOR CARRYING OUT THE INVENTION

Figure 1:
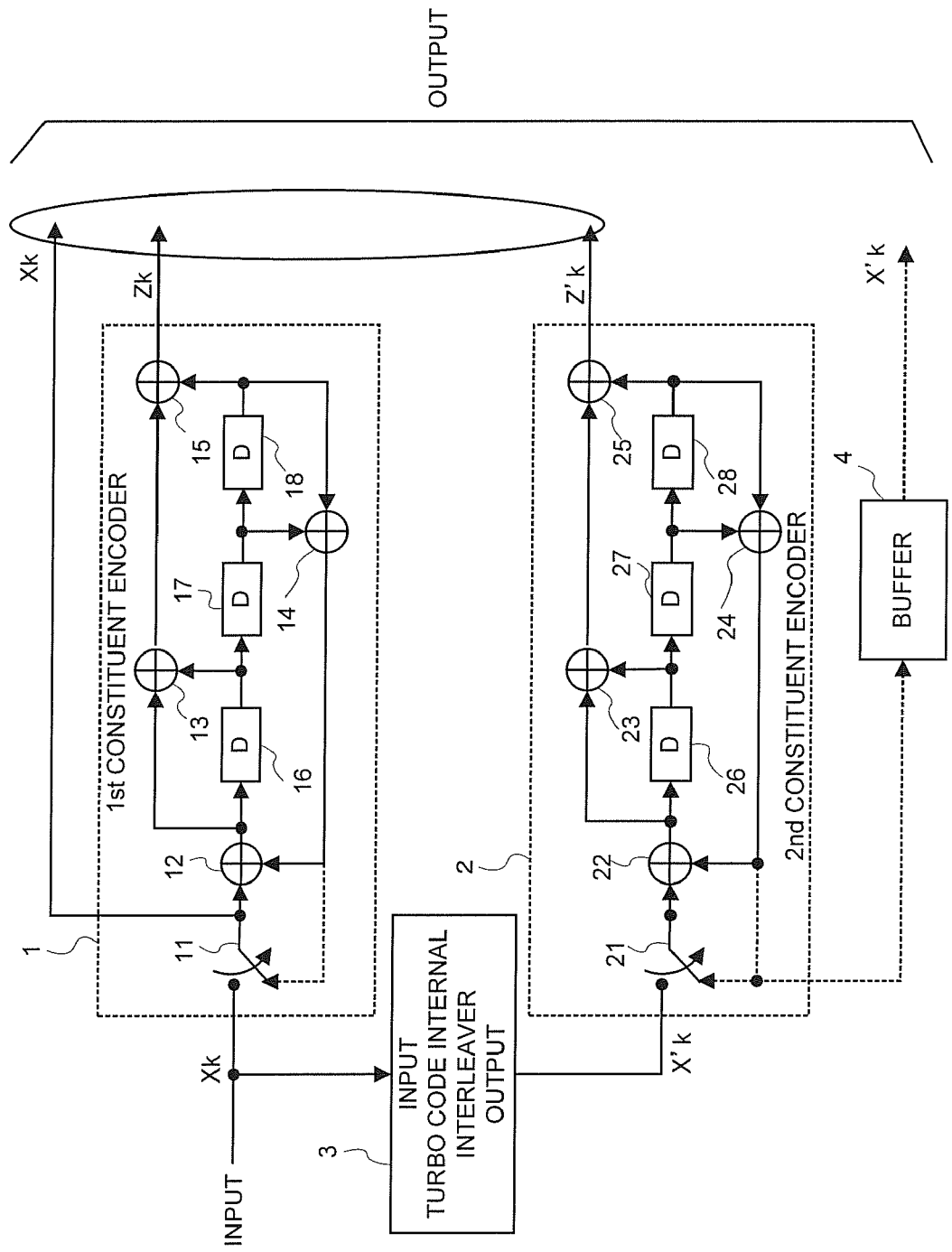
FIG. 1 is a block diagram illustrating a configuration of the turbo encoder in accordance with one example of the present invention.

Next, an example of the present invention will be explained by making a reference to the accompanied drawings. FIG. 1 is a block diagram illustrating a configuration of the output device of the turbo encoder in accordance with one example of the present invention. In FIG. 1, the output device of the turbo encoder in accordance with one example of the present invention is configured of a 1st constituent encoder 1, a 2nd constituent encoder 2, an interleaver (turbo code internal interleaver) 3, and a buffer 4.

The 1st constituent encoder 1 is configured of a switch 11, operators (adders) 12 to 15, and delay circuits (D) 16 to 18, and the 2nd constituent encoder 2 is configured of a switch 21, operators (adders) 22 to 25, and delay circuits (D) 26 to 28.

The end bit for setting the bit held by each constituent encoder (the 1st constituent encoder 1 and the 2nd constituent encoder 2) back to zero after finishing the turbo coding of the data sequence is called a tail bit. A performance of the turbo encoder in accordance with one embodiment of the present invention is improved with the process such that the tail bit of the data coding sequence (Systematic sequence) is prevented from being punctured when the rate matching is carried out. The so-called puncturing process is a process of extracting the bit from the bit sequence at a constant period.

In this example, the bit separating process that is performed at the time of carrying out the HARQ (Hybrid Automatic Repeat reQuest) with the tail bit process of the turbo encoder, and the 1st rate matching processing technique will be described. At first, a configuration of the turbo encoder in accordance with one example of the present invention will be explained.

The turbo encoder includes two constituent encoders (the 1st constituent encoder 1 and the 2nd constituent encoder 2). One constituent encoder (the 1st constituent encoder 1) directly inputs a data coding sequence, whereas the other constituent encoder (the 2nd constituent encoder 2) inputs a sequence mixed with the data coding sequence by the interleaver 3.

Specifically, the data coding sequence (Systematic Bits) Xk is redundant data sequences Zk and Z'k that are output from two constituent encoders (the 1st constituent encoder 1 and the 2nd constituent encoder 2). Data coding information X'k obtained by performing an interleaving process for the data coding sequence is not outputted. The reason is that if the decoding side can decode the data coding sequence Xk, performing the interleaving process for its decoding result enables X'k to be obtained. However, in the case of encoding the tail bit, information X'k as well obtained by performing an interleaving process for the tail bit has to be outputted.

At this time, the tail bit information of the interleaved information X'k is stored temporarily into the buffer 4 in order to easily perform the HARQ process that is later performed. A code rate of the turbo code is ⅓, and the output order is an order of X1, Z1, Z'1, X2, Z2, Z'2, ..., Xn, Zn and Z'n [where n=a code block size of the turbo coding]. However, with the coding of the tail bit, according to a route of a signal line shown by dotted lines of FIG. 1, Xn+1, Zn+1, Z'n+1, Xn+2, Zn+2, Z'n+2, Xn+3, Zn+3, Z'n+3, X'n+1, X'n+2, and X'n+3 are outputted in this order. That is, the information X'k (in an example of FIG. 1, X'n+1, X'n+2, and X'n+3) obtained by interleaving the tail bit stored into the buffer 4 is outputted lastly.

Figure 2:
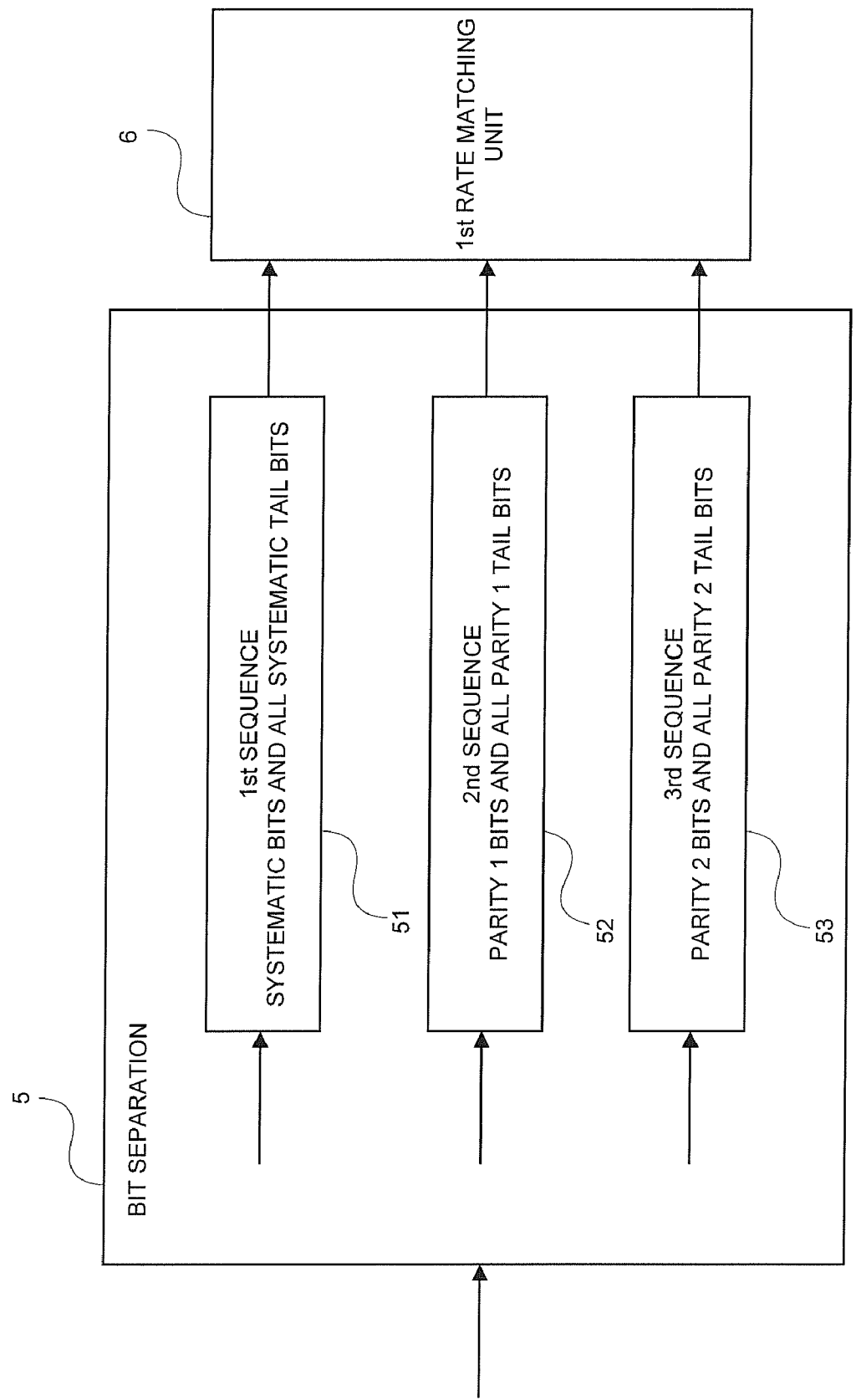
FIG. 2 is a view illustrating a bit separation processing method in accordance with one example of the present invention.

FIG. 2 is a view illustrating a bit separation processing method in accordance with one example of the present invention. In FIG. 2, the bit separating process at the time of the HARQ process is shown. In FIG. 2, this bit separating process is performed in a bit separation unit 5 prior to the process by a 1st rate matching unit 6. The bit separation unit 5 performs processes of a 1st sequence 51, a 2nd sequence 52, and a 3rd sequence 53.

The turbo-coded data sequence basically lines up in an order of the data coding bit (Systematic bit), the Parity 1 bit, and the Parity 2 bit, whereby sequentially separating them makes it possible to separate them into three sequences of the Systematic, the Parity 1, and the Parity 2. However, the tail bit information X' existing in an end of the data sequence lines up in the last of the Systematic sequence.

That is, it follows that the 1st sequence 51: (all Systematic bits)+(all Systematic tail bits), the 2nd sequence 52: (all Parity 1 bits)+(all Parity 1 tail bits), and the 3rd sequence 53: (all Parity 2 bits)+(all Parity 2 tail bits).

Next, the 1st rate matching process of the HARQ process will be explained. In the 1st rate matching process, the number $N^{TTI}$ per TTI (Transmission Timing Interval) of the bits subsequent to the turbo coding is caused to match with the bit number $N_{IR}$ of a virtual IR buffer (not shown in the figure) that can be utilized for the above HARQ process.

When $NIR \geq N^{TTI}$, no process is performed for the data even though the 1st rate matching stage is transparent hereto.

When $N_{IR} < N^{TTI}$ the number of the bits that should be punctured.

$$\Delta N_{il}^{TTI} = N_{IR} - N^{TTI} \quad \text{[Numerical equation 5]}$$

is computed, thereby to perform a puncturing process.

The rate matching parameters of the Parity 1 bit and the Parity 2 bit are computed as follows.

(1) Set a=2 when b=2;
a=1 when b=3
In a case of puncturing the Parity 1 bit, it follows that b=2.

In a case of puncturing the Parity 2 bit, it follows that b=3.
(2) Set $$\Delta N_i = \begin{cases} \lfloor \Delta N_{il}^{TTI}/2 \rfloor, b=2 \\ \lceil \Delta N_{il}^{TTI}/2 \rceil, b=3 \end{cases} \quad \text{[Numerical equation 6]}$$

where,

A function $\lceil y \rceil$: an integral value is obtained that is,
$y \leq \lceil y \rceil < y+1$ A function $\lfloor y \rfloor$: an integral value is obtained, that is,
$y-1 < \lfloor y \rfloor \leq y$ [Numerical equation 7]

(3) Computation of the rate matching parameter $K_i = (N^{TTI} - L)/3$ $e_{ini} = K_i$ $e_{plus} = \alpha \times K_i$ $e_{minus} = \alpha \times |\Delta N_i|$ where, L is data coding information obtained by interleaving the tail bit, and it follows that L=3 (that is, X'n+1, X'n+2, and X'n+3) with the turbo encoder shown in FIG. 1

The 1st rate matching process of the HARQ process is performed according to the above-mentioned rate matching parameter. In this example, similarly to the conventional method described above, the number of the input bit from the turbo encoder is caused to match with the number ($N_{IR}$) of the bits allocated the virtual IR buffer. Also in the 2nd rate matching process of the HARQ process, similarly to the conventional method described above, the bit number subsequent to the 1st rate matching process is caused to match with the total bit number of HS-PDSCH (High Speed-Physical Downlink Shared Channel) to which HS-DSCH (High Speed-Downlink Shared Channel) is mapped at its TTI.

Figure 3:
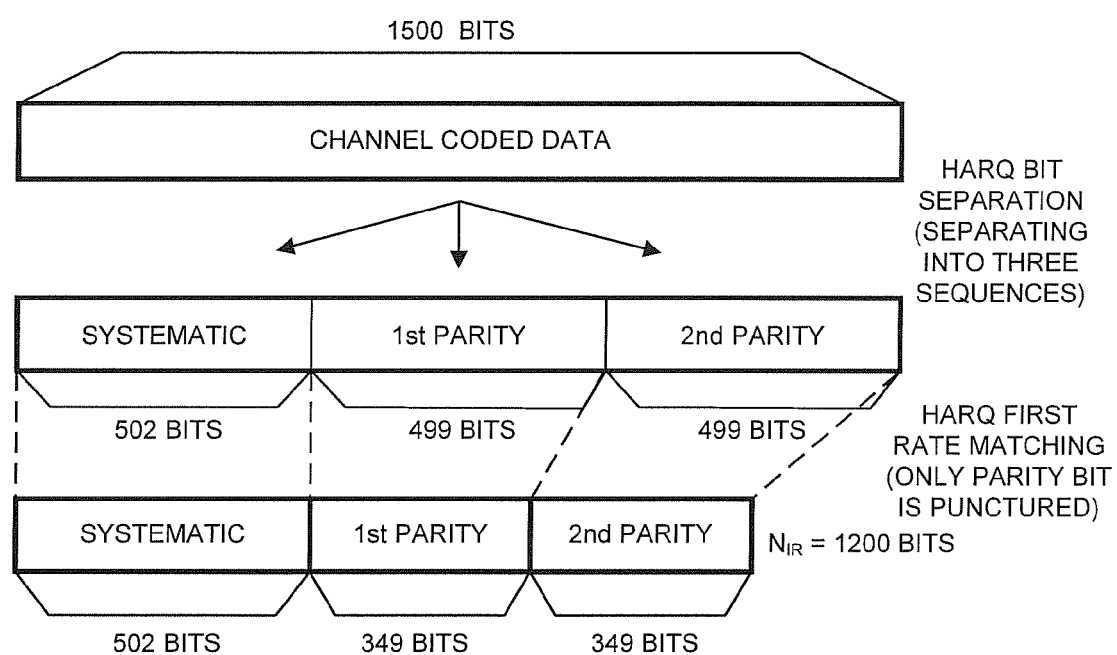
FIG. 3 is a view illustrating one example of the 1st rate matching process of the HARQ process that is performed for an output of the turbo encoder shown in FIG. 1.
Figure 4:
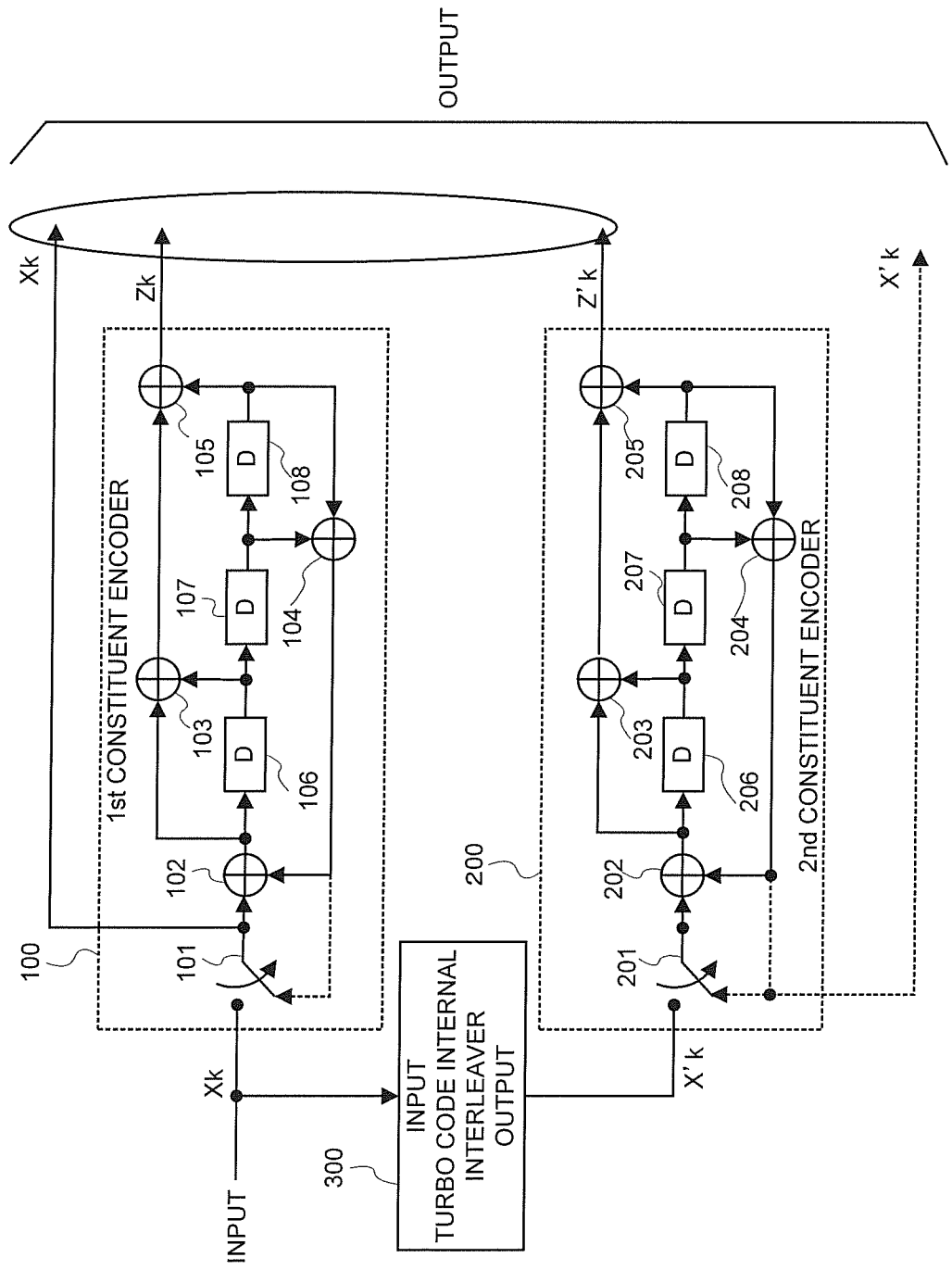
FIG. 4 is a block diagram illustrating a configuration of the conventional turbo encoder.
Figure 5:
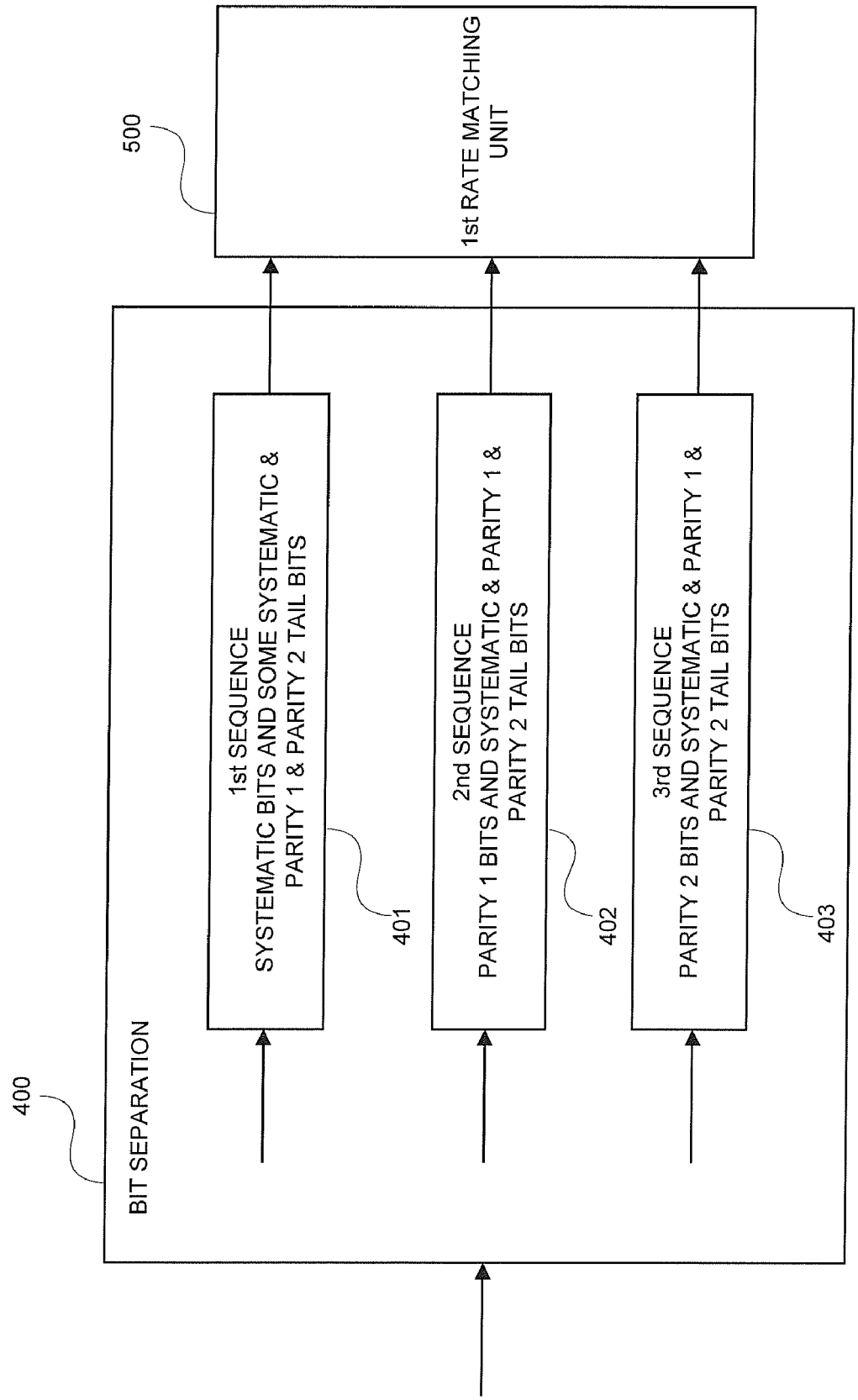
FIG. 5 is a view illustrating the conventional bit separation processing method.
Figure 6:
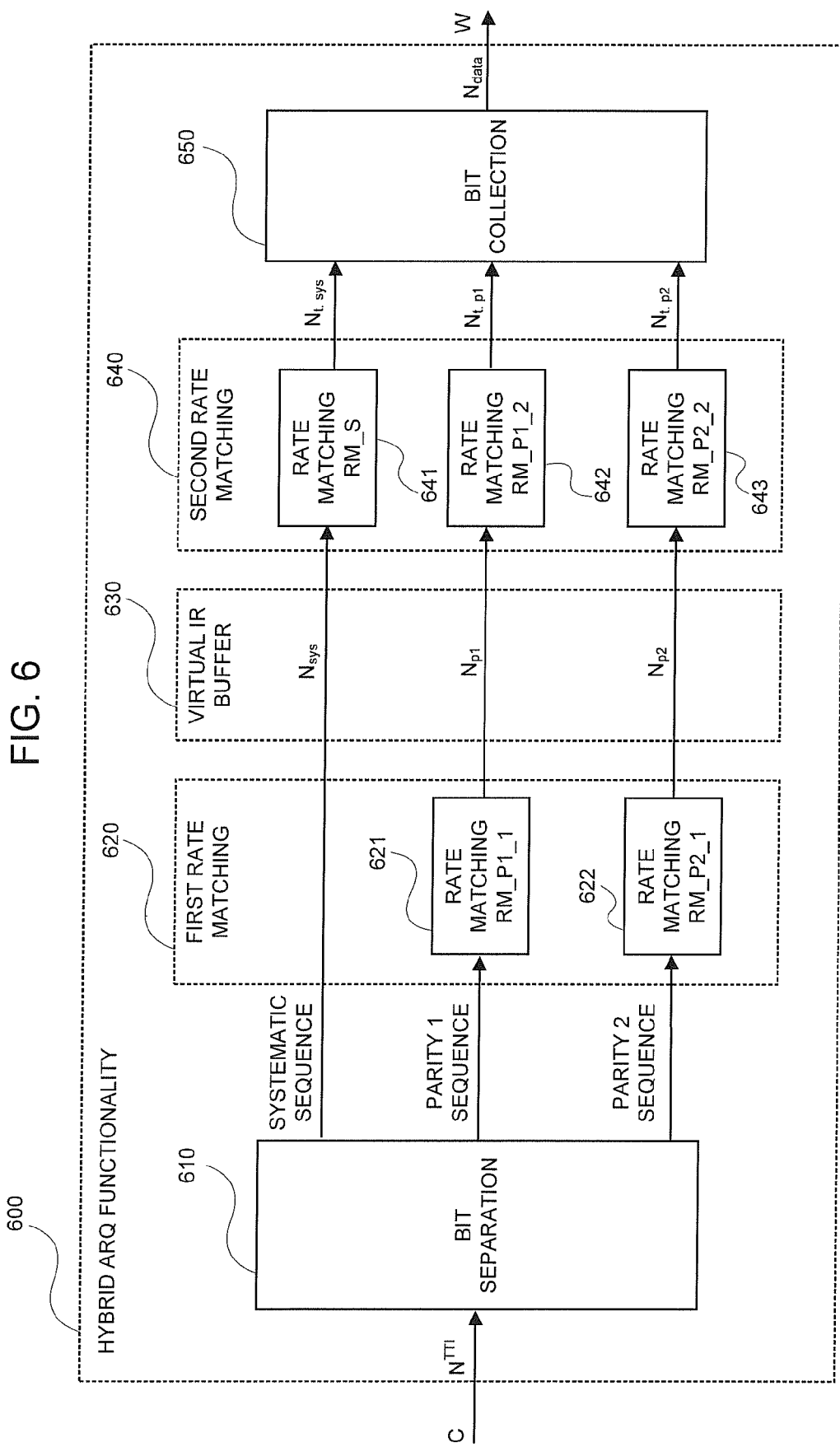
FIG. 6 is a view illustrating a flow of the HARQ process in HSDPA.
Figure 7:
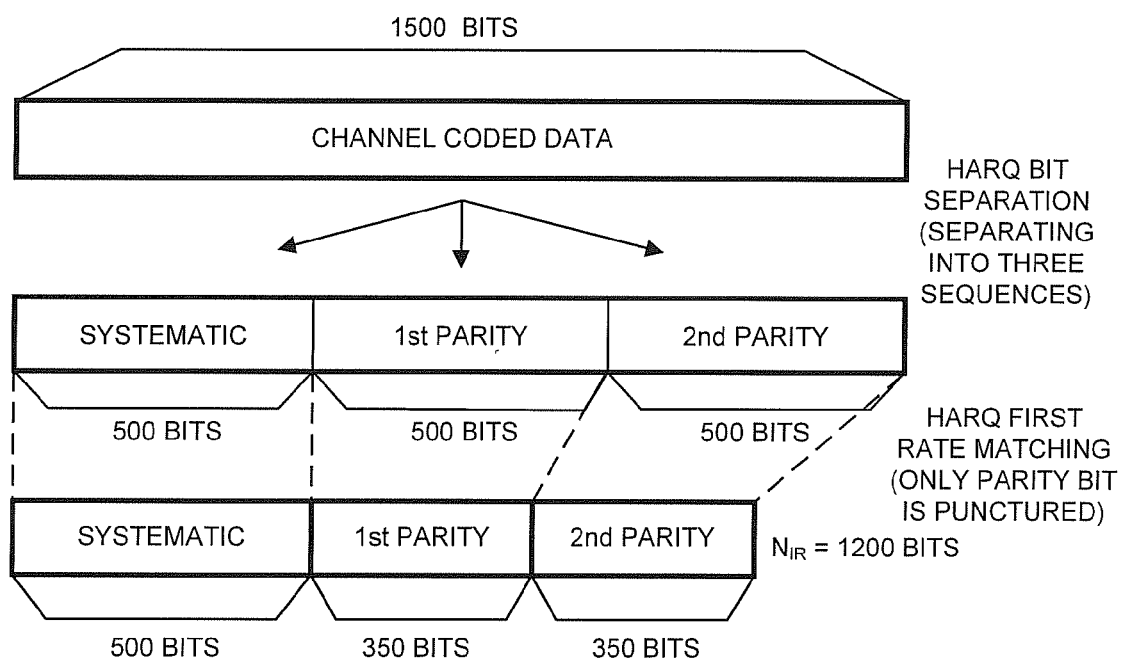
FIG. 7 is a view illustrating an example of the 1st rate matching process in the HARQ process.

FIG. 3 is a view illustrating one example of the 1st rate matching process of the HARQ process that is performed for an output of the turbo encoder shown in FIG. 1. In FIG. 3, an example of the 1st rate matching process of the HARQ process at the time that the bit number $N^{TTI}$ subsequent to the channel coding is 1500 and the number $N_{IR}$ of the bits allocated to the virtual IR buffer is 1200 ($N_{IR}=1200$) is shown.

In the bit separation of the HARQ process, the turbo-coded data is separated into three sequences of the data coding (Systematic) sequence, the Parity 1 sequence, and the Parity 2 sequence. In this case, the data coding sequence is configured of 496-bit code information and 6-bit tail bit information, and each of the Parity 1 sequence and the Parity 2 sequence is configured of 496-bit code information and 3-bit tail bit information.

Next, in the 1st rate matching of the HARQ process, the rate matching with a capacity $N_{IR}=1500$ of the virtual IR buffer is carried out (it is only the parity bit that is punctured).

Upon calculating the 1st rate matching parameter with the above-described method, $$\Delta N_{il}^{TTI} = 1200 - 1500 = -300 \quad \text{[Numerical equation 8]}$$

$K_i = (1500-3)/3 = 499$

The rate matching parameter of the Parity 1 is as follows.

$e_{ini} = 499$ $e_{plus} = 2 \times 499 = 998$ $e_{minus} = 2 \times |\Delta N_i| = 2 \times 150 = 300$ And, the rate matching parameter of the Parity 2 is as follows.

$e_{ini}=499$ $e_{plus}=499$ $e_{minus}=|\Delta N_i|=150$

The position in which the bits of the Parity 1 and the Parity 2 are removed is decided according to the above-mentioned rate matching parameters.

In such a manner, in this example, preventing the tail bit of the data coding sequence from being punctured at the time of carrying out the 1st rate matching of the HARQ process makes it possible to improve a performance in the encoder in particular when the redundancy is low (a large number of the parity bits are punctured).

Further, in this example, an improvement in the performance of the encoder can be easily realized because an improvement in the performance of the encoder can be realized by adding a simplified circuit. Such a decoding process is demanded in particular when a turbo encoding/decoding device has been installed into an appliance such as a portable telephone that is strictly requested to have an error correcting ability.

Additionally, while the present invention has been disclosed with respect to the illustrative embodiments and use methods thereof, it will be appreciated that those skilled in the art may readily conceive of alterations to, variations of, and equivalents to these embodiments without departing from a scope of the present invention. For example, while it is envisaged that the tail bit process of the present invention and the rate matching process subsequent to it are applied to the wireless communication system into which an HSDPA (High Speed Downlink Packet Access) function has been installed in W-CDMA (Wideband-Code Division Multiple Access), they are applicable to all wireless communication systems utilizing the turbo coding.

This application is based upon and claims the benefit of priority from Japanese patent application No. 2006-137145, filed on May 17, 2006, the disclosure of which is incorporated herein in its entirety by reference.

The invention claimed is:

1. A PLL circuit that extracts a synchronizing clock from an analog signal in which a channel frequency changes, said PLL circuit comprising:
    a phase synchronization loop having a loop gain and comprising: an A/D converter that converts the analog signal into a digital signal; a digital phase comparator that operates in synchrony with the synchronizing clock to output a phase error signal between the analog signal and the synchronizing clock based on the digital signal output from said A/D converter; a digital loop filter that operates in synchrony with the synchronizing clock to output a digital frequency value proportional to the channel frequency based on the phase error signal; and an oscillator that outputs the synchronizing clock having a frequency controlled based on the digital frequency value; and
    a loop-gain control unit that controls the loop gain of said phase synchronization loop based on said digital frequency value.

2. The digital PLL circuit according to claim 1, wherein said digital phase comparator holds an output thereof at a timing other than an edge timing of the analog signal in the phase error signal generated at said edge timing.

3. The digital PLL circuit according to claim 2, wherein said digital phase comparator clears the held phase error signal generated at said edge timing if an edge of said analog signal is not detected for a specific time length.

4. The digital PLL circuit according to claim 1, wherein said loop-gain control unit comprises a multiplier that multiplies the phase error signal output from said digital phase comparator by a value corresponding to the digital frequency value output from said digital loop filter to output the multiplied value to said digital loop filter.

5. The digital PLL circuit according to claim 4, wherein said loop-gain control unit multiplies the phase error signal output from said digital phase comparator by a product of the digital frequency value output from the digital loop filter and a specific coefficient.

6. The digital PLL circuit according to claim 1, wherein said A/D converter performs, in synchrony with the synchronizing clock, A/D conversion of the analog signal into the digital signal.

7. The digital PLL circuit according to claim 1, wherein said oscillator is a voltage controlled oscillator that oscillates on a frequency corresponding to an analog voltage value that is obtained by D/A conversion of the digital frequency value.

8. The digital PLL circuit according to claim 1, wherein said A/D converter includes an interpolator that operates in synchrony with a clock signal having a higher frequency than the synchronizing clock, estimates based on the digital signal output from said A/D converter a sampled value of the digital signal that is in synchrony with the synchronizing clock, and outputs the sampled value to said digital phase comparator.

9. The digital PLL circuit according to claim 8, wherein said oscillator is a numerically-controlled oscillator that generates the synchronizing clock based on the digital frequency value from a clock signal having a higher frequency than the synchronizing clock, and delivers to said interpolator interpolated phase information relating to a phase difference between the clock signal and the synchronizing clock.

10. The digital PLL circuit according to claim 9, wherein said interpolator estimates the sampled value of the digital signal in synchrony with the synchronizing clock based on values of the digital signal sampled on at least two adjacent sampling points and output from the A/D converter and the interpolated phase information by using a specific interpolation function.

11. A disk drive that reproduces data from a disk by using a CAV (constant angular velocity) control technique, comprising:
    a phase synchronization loop having a loop gain and comprising: an A/D converter that converts into a digital readout signal a readout signal obtained by reading information recorded on the disk; a digital phase comparator that operates based on a synchronizing clock extracted from the readout signal to output a phase error signal between the readout signal and the synchronizing clock based on the digital readout signal; a digital loop filter that operates based on the synchronizing clock to output a digital frequency value in proportion to a channel frequency of the readout signal based the phase error signal; and an oscillator that outputs the synchronizing clock having a frequency controlled based on the digital frequency value;
    a loop-gain control unit that controls the loop gain of said phase synchronization loop based on said digital frequency value; and
    a data demodulator that operates based on the synchronizing clock to identify data from the digital readout signal.

12. A disk drive that records data on an optical disk by using a CAV (constant angular velocity) control technique, comprising:

a phase synchronization loop having a loop gain and comprising: an A/D converter that converts into a digital wobble signal a wobble signal that is read from the disk; a digital phase comparator that operates based on a clock extracted from the wobble signal to output a phase error signal between the wobble signal and a synchronizing clock based on the digital wobble signal; a digital loop filter that outputs a digital frequency value that is in proportion to a frequency of the wobble signal; an oscillator that outputs the synchronizing clock having a frequency controlled based on the digital frequency value, said phase synchronization loop multiplying the clock signal to generate a recording clock; and a loop-gain control unit that controls the loop gain of said phase synchronization loop based on said digital frequency value.

* * * * *